(12) United States Patent
Bae et al.

(10) Patent No.: US 12,082,331 B2
(45) Date of Patent: Sep. 3, 2024

(54) INDUCTIVELY COUPLED PLASMA REACTOR AND WIRE STRUCTURE FOR ANTENNA COIL OF INDUCTIVELY COUPLED PLASMA REACTOR

(71) Applicants: LOT CES CO., LTD., Osan-si (KR); LOT VACUUM CO., LTD., Osan-si (KR)

(72) Inventors: Jin Ho Bae, Hwaseong-si (KR); Min Jae Kim, Ansan-si (KR); Geon Bo Sim, Osan-si (KR)

(73) Assignees: LOT CES CO., LTD., Osan-si (KR); LOT VACUUM CO., LTD., Osan-si (KR)

( * ) Notice: Subject to any disclaimer, the term of this patent is extended or adjusted under 35 U.S.C. 154(b) by 130 days.

(21) Appl. No.: 17/918,101

(22) PCT Filed: Apr. 21, 2021

(86) PCT No.: PCT/KR2021/005042
§ 371 (c)(1),
(2) Date: Oct. 10, 2022

(87) PCT Pub. No.: WO2021/230518
PCT Pub. Date: Nov. 18, 2021

(65) Prior Publication Data
US 2023/0136312 A1     May 4, 2023

(30) Foreign Application Priority Data
May 15, 2020    (KR) .................. 10-2020-0058634

(51) Int. Cl.
*H05H 1/46*       (2006.01)
*H01J 37/32*      (2006.01)
(Continued)

(52) U.S. Cl.
CPC ....... *H05H 1/4652* (2021.05); *H01J 37/3211* (2013.01); *H01Q 1/26* (2013.01); *H05H 1/02* (2013.01)

(58) Field of Classification Search
None
See application file for complete search history.

(56) References Cited

U.S. PATENT DOCUMENTS 5,998,933 A * 12/1999 Shun'ko .................. H05H 1/46
                                                     156/345.48
6,475,333 B1 * 11/2002 Uchida ............. H01J 37/32431
                                                     156/345.46

(Continued)

FOREIGN PATENT DOCUMENTS

EP            637054 A1 * 2/1995 ........ H01J 37/32431
KR    10-2004-0026776 A     4/2004
(Continued)

OTHER PUBLICATIONS

International Search Report for PCT/KR2021/005042 mailed Aug. 26, 2021 from Korean Intellectual Property Office.

*Primary Examiner* — Srinivas Sathiraju
(74) *Attorney, Agent, or Firm* — Revolution IP, PLLC

(57) ABSTRACT

According to the present invention, provided is an inductively coupled plasma reactor including: a reaction chamber configured to provide a plasma reaction space; a ferrite core arranged to surround the plasma reaction space; and an antenna coil formed by winding a strip-shaped wire structure on the ferrite core, wherein the wire structure includes a plurality of electrically conductive wires and a covering made of a flexible material and configured to surround the plurality of electrically conductive wires.

7 Claims, 4 Drawing Sheets

(51) Int. Cl.
*H01Q 1/26* (2006.01)
*H05H 1/02* (2006.01)

(56) References Cited

U.S. PATENT DOCUMENTS

| | | | | |
|---|---|---|---|---|
| 6,916,399 | B1* | 7/2005 | Rozenzon | H01J 37/321 118/723 R |
| 9,533,909 | B2* | 1/2017 | Boughton | H05H 1/42 |
| 9,550,694 | B2* | 1/2017 | Boughton | C03B 5/185 |
| 9,908,804 | B2* | 3/2018 | Boughton | H01J 37/32825 |
| 10,167,220 | B2* | 1/2019 | Boughton | H05B 7/22 |
| 2002/0092619 | A1* | 7/2002 | Uchida | H01J 37/32431 204/298.37 |
| 2003/0015965 | A1* | 1/2003 | Godyak | H01J 37/32009 315/111.21 |
| 2004/0149218 | A1* | 8/2004 | Collins | H01J 37/32412 118/723 I |
| 2004/0166612 | A1* | 8/2004 | Maydan | H01J 37/321 438/149 |
| 2004/0263412 | A1* | 12/2004 | Pribyl | H01J 37/32082 343/866 |
| 2008/0050292 | A1* | 2/2008 | Godyak | H01J 37/321 422/186.29 |
| 2009/0015165 | A1* | 1/2009 | Jeon | H01J 37/321 315/111.51 |
| 2009/0108796 | A1* | 4/2009 | Choi | H02P 1/42 318/795 |
| 2009/0189083 | A1* | 7/2009 | Godyak | H01J 27/18 250/423 R |
| 2010/0065215 | A1* | 3/2010 | Jeon | H01J 37/321 156/345.48 |
| 2015/0108898 | A1* | 4/2015 | Cheung | H05H 1/30 315/111.51 |
| 2015/0274569 | A1* | 10/2015 | Boughton | H01J 37/32541 65/142 |
| 2018/0099149 | A1* | 4/2018 | Pai | A61L 2/14 |
| 2023/0136312 | A1* | 5/2023 | Bae | H01J 37/3211 315/111.51 |

FOREIGN PATENT DOCUMENTS

| | | | |
|---|---|---|---|
| KR | 10-2016-0138531 A | 12/2016 | |
| KR | 10-2019-0019651 A | 2/2019 | |
| WO | WO-2004114461 A2 * | 12/2004 | H01J 37/32082 |

* cited by examiner

INDUCTIVELY COUPLED PLASMA REACTOR AND WIRE STRUCTURE FOR ANTENNA COIL OF INDUCTIVELY COUPLED PLASMA REACTOR

TECHNICAL FIELD present invention relates to a technology for processing exhaust gas discharged from a process chamber of a semiconductor manufacturing facility using plasma, and more particularly, to an inductively coupled plasma reactor for processing exhaust gas discharged from a process chamber of a semiconductor manufacturing facility using inductively coupled plasma.

BACKGROUND ART

Semiconductor devices are manufactured by repeatedly performing processes such as photolithography, etching, diffusion, and metal deposition on a wafer in a process chamber. During a semiconductor manufacturing process, various process gases are used, and after the process is completed, a residual gas in the process chamber contains various harmful components such as PFCs. The residual gas in the process chamber is discharged through an exhaust line by a vacuum pump after the process is completed, and the exhaust gas is purified by an exhaust gas processing device so that harmful components are not discharged as they are.

Recently, a technique of decomposing and processing harmful components using a plasma reaction has been widely used. As a prior art related to the present invention, Korean Patent Laid-open Publication No. 2019-19651 discloses a plasma chamber for processing exhaust gas using inductively coupled plasma. In inductively coupled plasma, when radio frequency power is applied to the antenna coil, a magnetic field is induced by a time-varying current flowing through the antenna coil, thereby generating plasma by an electric field generated inside the chamber. In general, a plasma reactor for inductively coupled plasma includes a chamber providing a space for generating plasma, a ferrite core coupled to surround the chamber, an antenna coil wound around the ferrite core, and an igniter for initial plasma ignition.

Because the current flowing through the antenna coil is proportional to the cross-sectional area of a wire forming the antenna coil, in order to apply a high voltage, a thick wire needs to be used to form the antenna coil. However, when the thick wire is used, it is difficult to manufacture a plasma reactor. Although the antenna coil is sometimes formed by using a copper plate instead of the thick wire, workability is lowered even in the case of the copper plate because the copper plate is easily damaged and not easy to bend.

DETAILED DESCRIPTION OF THE INVENTION

Technical Problem

The present invention provides an inductively coupled plasma reactor and a wire structure for an antenna coil of an inductively coupled plasma reactor.

Technical Solution

According to an aspect of the present invention, there is provided an inductively coupled plasma reactor including a reaction chamber configured to provide a plasma reaction space, a ferrite core arranged to surround the plasma reaction space, and an antenna coil formed by winding a strip-shaped wire structure on the ferrite core, wherein the wire structure includes a plurality of electrically conductive wires and a covering made of a flexible material and configured to surround the plurality of electrically conductive wires.

According to another aspect of the present invention, there is provided a wire structure for an antenna coil of an inductively coupled plasma reactor so as to form the antenna coil by winding the antenna coil on a ferrite core in the inductively coupled plasma reactor including a reaction chamber configured to provide a plasma reaction space and a ferrite core arranged to surround the plasma reaction space, the wire structure including a plurality of electrically conductive wires arranged in parallel, and a strip-shaped covering made of a flexible material and configured to surround the plurality of electrically conductive wires.

Effects of the Invention

According to the present invention, all the objectives of the present invention described above can be achieved. Specifically, in an inductively coupled plasma reactor including a reaction chamber providing a plasma reaction space and a ferrite core disposed to surround the plasma reaction space, a thin strip-shaped wire structure including a plurality of electrically conductive wires and a covering formed of a flexible material for surrounding the plurality of electrically conductive wire is wound around the ferrite core so as to form an antenna coil, so that the antenna coil capable of applying a high voltage can be easily formed with improved workability.

MODE OF THE INVENTION

Hereinafter, the configuration and operation of an embodiment of the present invention will be described in detail with reference to the drawings.

Figure 1:
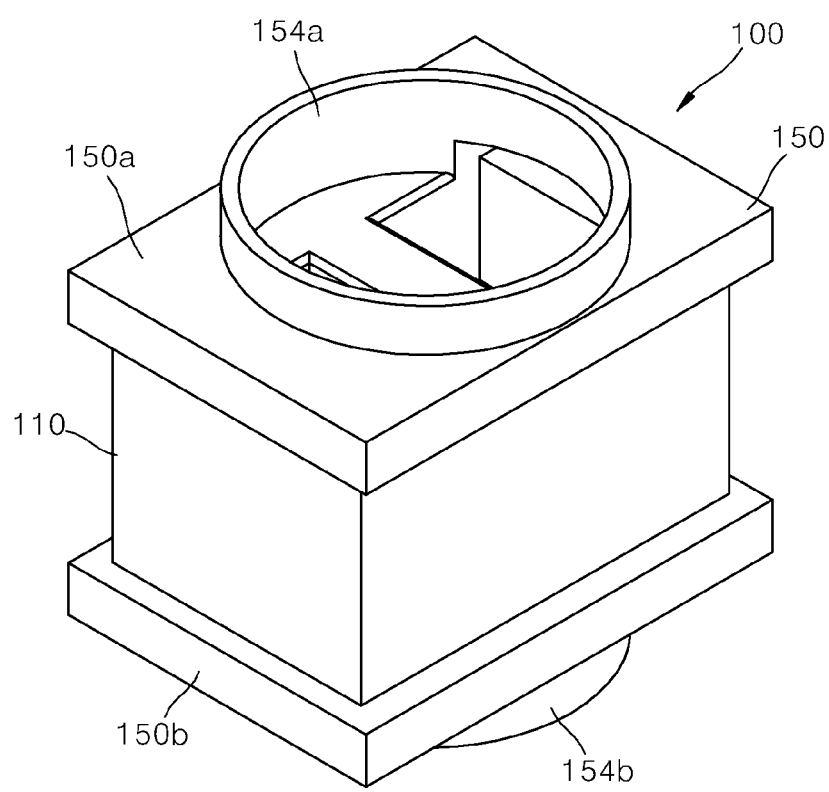
FIG. 1 is a perspective view illustrating an inductively coupled plasma reactor according to an embodiment of the present invention.
Figure 2:
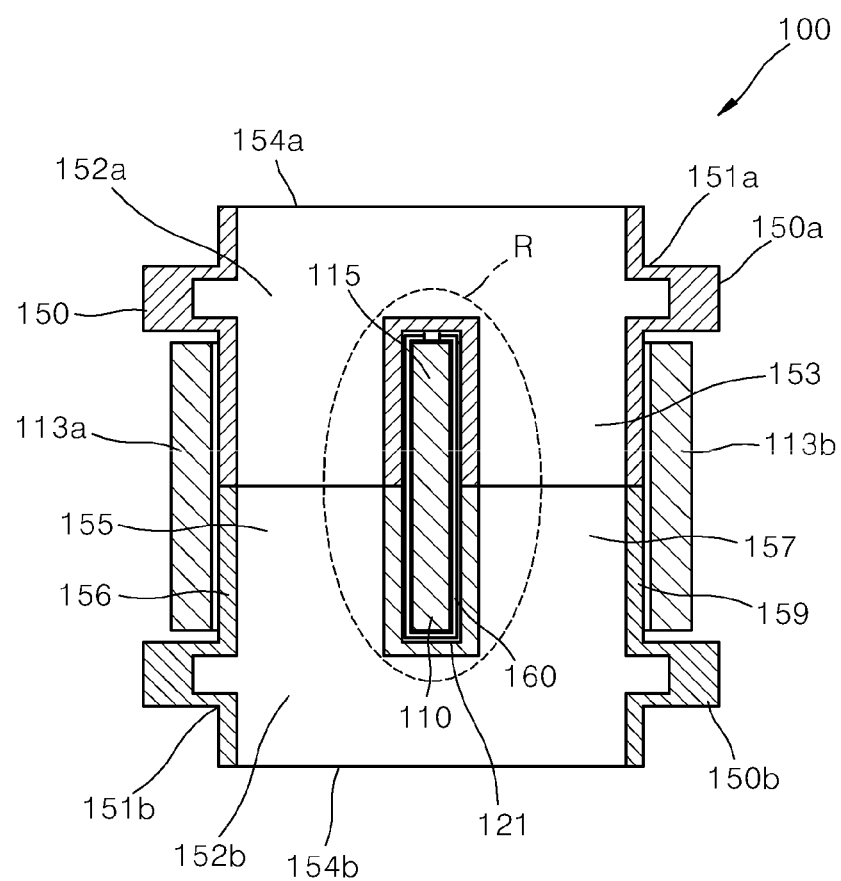
FIG. 2 is a longitudinal cross-sectional view of the inductively coupled plasma reactor shown in FIG. 1.
Figure 3:
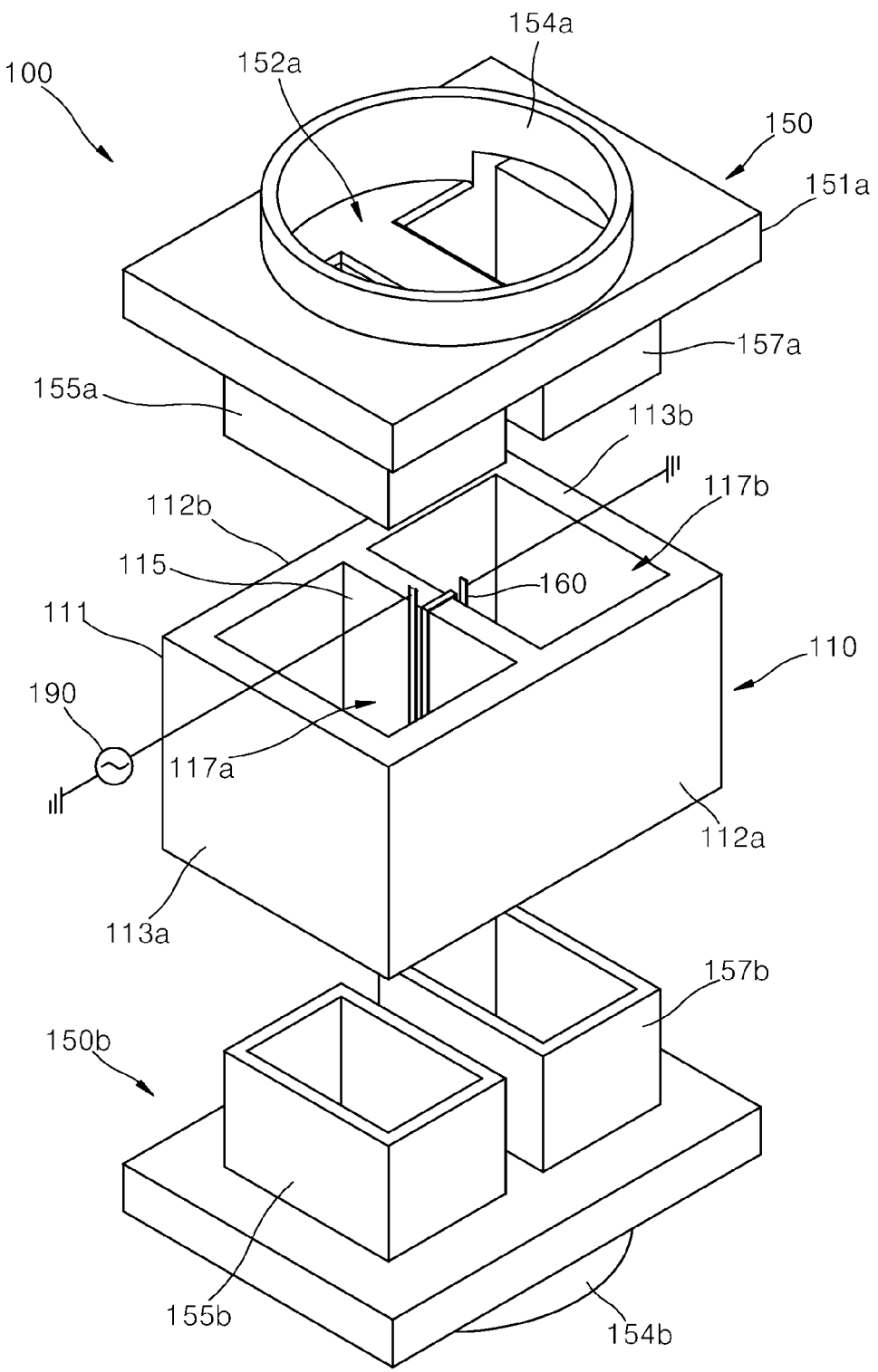
FIG. 3 is an exploded perspective view illustrating the inductively coupled plasma reactor shown in FIG. 1.

An inductively coupled plasma reactor according to an embodiment of the present invention is shown in a perspective view in FIG. 1, in a longitudinal sectional view in FIG. 2, and in an exploded perspective view in FIG. 3. Referring to FIGS. 1, 2, and 3, an inductively coupled plasma reactor 100 according to an embodiment of the present invention includes a reaction chamber 150, a ferrite core 110 disposed to surround the reaction chamber 150, and an antenna coil 160 formed by winding a wire structure according to the present invention around the ferrite core 110. In the present embodiment, the inductively coupled plasma reactor 100 is described as being installed in an exhaust pipe through which residual gas generated from a process chamber in a semiconductor manufacturing facility is discharged so that the exhaust gas flowing along the exhaust pipe is processed by using inductively coupled plasma. The present invention does not limit the use and installation location of the inductively coupled plasma reactor 100 in this way. The inductively coupled plasma reactor 100 is operated by receiving appropriate alternating current (AC) power from a power source 190.

The reaction chamber 150 is a chamber having a toroidal shape, and a plasma reaction space 153 in which a plasma reaction to a gas to be processed occurs, is formed in the reaction chamber 150. The reaction chamber 150 is provided with a gas inlet 154a that communicates with the plasma reaction space 153 and introduces the gas to be processed into the plasma reaction space 153, and a gas outlet 154b through which the plasma-processed gas in the plasma reaction space 153 is discharged to the outside. The reaction chamber 150 includes a first base portion 151a that is in communication with the gas inlet 154a, a second base portion 151b that is in communication with the gas outlet 154b, and first and second connection pipes 156 and 159 that connect the two base portions 151a and 151b.

The first base portion 151a provides a first internal space 152a therein, and the gas inlet 154a which is in communication with the first internal space 152a and through which the gas to be processed is introduced, is formed in the first base portion 151a. Although not shown, an igniter is inserted and installed in the first base portion 151a.

The first internal space 152a communicates with the gas inlet 154a, the first connection passage 155, and the second connection passage 157. In the drawing, the gas inlet 154a is in communication with the upper part of the first internal space 152a, and the first and second connection passages 155 and 157 are in communication with the lower part of the first internal space 152a. The gas to be processed flowing through the gas inlet 154a flows through the first internal space 152a to the first connection passage 155 and the second connection passage 157.

The second base portion 151b is spaced apart from the first base portion 151a, provides a second internal space 152b therein, and the gas outlet 154b which is in communication with second internal space 152b and through which the gas is discharged, is formed in the second base portion 151b. Although not shown, an igniter is inserted and installed in the second base portion 151b. The second base portion 151b is connected to the first base portion 151a by the first connection pipe 156 and the second connection pipe 159.

The second internal space 152b is spaced apart from the first internal space 152a and communicates with the gas outlet 154b, the first connection passage 155 and the second connection passage 157. In the drawing, the second internal space 152b is located below the first internal space 152a, the gas outlet 154b communicates with the lower part of the second internal space 152b, and the first and second connection passages 155 and 157 communicate with the upper part of the second internal space 152b. The gas flowing along the first and second connection passages 155 and 157 is discharged to the outside through the gas outlet 154b through the second internal space 152b.

The first connection pipe 156 and the second connection pipe 159 are arranged in parallel to connect the first base portion 151a and the second base portion 151b. The first connection passage 155 through which the first internal space 152a of the first base portion 151a and the second internal space 152b of the second base portion 151b to communicate with each other, is formed inside the first connection pipe 156, and the second connection passage 157 through which the second internal space 152b of the first base portion 151a and the second internal space 152b of the second base portion 151b to communicate with each other, is formed inside the second connection pipe 159. The first connection pipe 156 and the second connection pipe 159 are spaced apart from each other, and a slot 121 is formed between the first connection pipe 156 and the second connection pipe 159.

The first internal space 151a, the second internal space 151b, the first connection passage 155 and the second connection passage 157, which are connected to each other, form the plasma reaction space 153. Plasma is generated in the plasma reaction space 153 along an annular discharge loop R as shown by a broken line in FIG. 2.

In the present embodiment, it will be described that the reaction chamber 150 is configured by combining a first chamber unit 150a and a second chamber unit 150b by an appropriate coupling unit.

The first chamber unit 150a includes the first base portion 151a, and a first A-extension pipe 155a and a second A-extension pipe 157a extending from the first base portion 151a.

The first base portion 151a provides the first internal space 152a therein, and the first base portion 151a which communicates with the first internal space 152a and the gas inlet 154a and through which the gas to be processed is introduced, is formed in the first base portion 151a. Although not shown, an igniter is inserted and installed in the first base portion 151a.

The first A-extension pipe 155a and the second A-extension pipe 157a communicate with a first internal space 162a of the first base portion 151a, and the end of the first A-extension pipe 165a and the end of the second A-extension pipe 167a are open. The open end of the first A-extension pipe 165a and the open end of the second A-extension pipe 167a are connected to the second chamber unit 150a.

The second chamber unit 150b has substantially the same structure as the first chamber unit 150a and includes a second base portion 151b and a first B-extension pipe 155b and a second B-extension pipe 157b, which extend from the second base portion 151b.

The second base portion 151b provides a second internal space 152b therein, and the second base portion 151b which communicates with the second internal space 152b and through which the gas to be processed is introduced, is formed in the second base portion 151b. Although not shown, an igniter is inserted and installed in the second base portion 151b.

The first B-extension pipe 155b and the second B-extension pipe 157b are formed to extend parallel to each other from the second base portion 151b. The first B-extension pipe 155b and the second B-extension pipe 157b communicate with the second inner space 152b of the second base portion 151b, and the end of the first B-extension pipe 155b and the end of the second B-extension pipe 157b are open. The first A-extension pipe 155a and the second B-extension pipe 155b are connected to each other to form the first connection pipe 156, and the second A-extension pipe 157a and the second B-extension pipe 157b are connected to each other to form the second connection portion 159. Although not shown, a direct current (DC) breaker is located between the end of the first A-extension pipe 155a and the end of the first B-extension pipe 155b and between the end of the second A-extension pipe 157a and the end of the second B-extension pipe 157b.

The ferrite core 110 includes a border wall 111 and a partition wall 115 positioned inside the border wall 111. The ferrite core 110 is disposed to surround a part of the plasma reaction space 153 formed in the reaction chamber 150. The ferrite core 110 is formed with a first passage portion 117a and a second passage portion 117b extending in the vertical direction in the drawing. The first passage portion 117a and the second passage portion 117b pass through the ferrite core 110 so that both ends of the upper and lower portions thereof are opened, and the side surfaces thereof are blocked. In the present embodiment, the ferrite core 110 will be described as being a ferrite core commonly used in an inductively coupled plasma device.

The border wall 111 includes first and second long wall portions 112a and 112b, which are formed to have a rectangular circumference and face each other, and first and second short wall portions 113a and 113b, which have smaller widths than those of the first and second long wall portions 112a and 112b. Each of the first short wall portion 113a and the second short wall portion 113b connects opposite ends of the first long wall portion 112a and the second long wall portion 112b in a width direction so that the first long wall portion 112a, the first short wall portion 113a, the second long wall portion 112b, and the second short wall portion 113b are continuously connected along the circumferential direction of the border wall 111.

The partition wall 115 extends in a straight line between the two opposite long wall portions 112a and 112b of the border wall 111. Both ends of the partition wall 115 are connected to a middle portion in the width direction of each of the two long wall portions 112a and 112b. By the partition wall 115, the inner region of the border wall 111 is divided into the first passage portion 117a and the second passage portion 117b having a rectangular shape, respectively. The wire structure according to the present invention is wound around the partition wall 115 to form the antenna coil 160.

The ferrite core 110 is located between the first base portion 151a and the second base portion 151b of the reaction chamber 150, and the first connection pipe 156 of the reaction chamber 150 passes through the first passage portion 117a formed in the ferrite core 110, and the second connection pipe 159 of the reaction chamber 150 passes through the second passage portion 117b formed in the ferrite core 110. Accordingly, the partition wall 115 of the ferrite core 110 is positioned in the slot 121 formed between the first connection pipe 156 and the second connection pipe 159 of the reaction chamber 150.

The antenna coil 160 is formed by winding the wire structure according to the present invention around the partition wall 115 of the ferrite core 110 and is located in the slot 121 formed between the first connection pipe 156 and the second connection pipe 159 of the reaction chamber 150 together with the partition wall 115 of the ferrite core 110.

Figure 4:
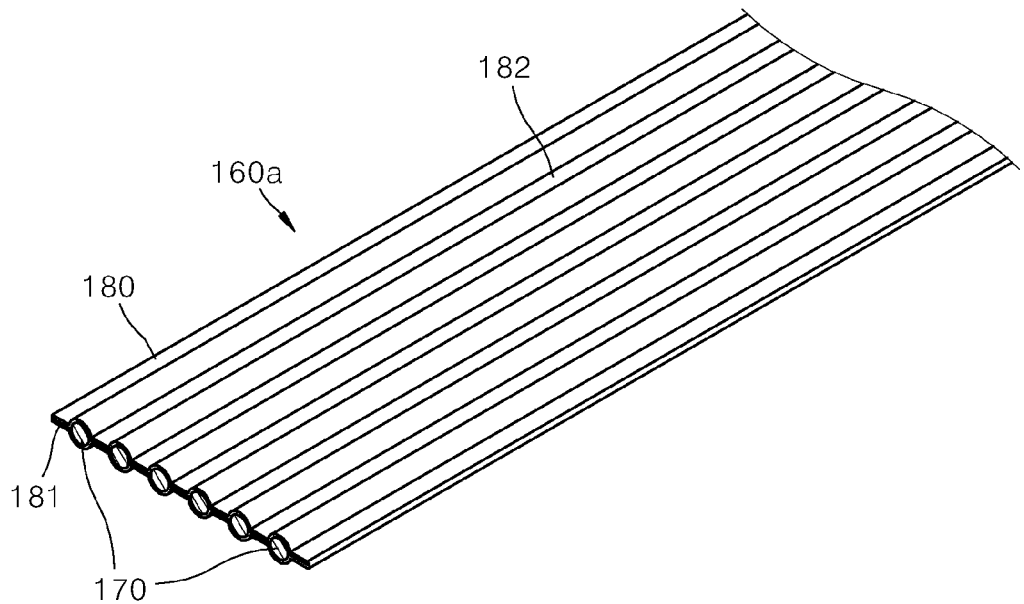
FIG. 4 is a view illustrating a cross-sectional structure of a wire structure for an antenna coil of an inductively coupled plasma reactor according to an embodiment of the present invention.

FIG. 4 shows a cross-sectional structure of an antenna coil of an inductively coupled plasma reactor according to an embodiment of the present invention. The antenna coil 160 shown in FIGS. 2 and 3 is formed by winding a wire structure having the configuration as shown in FIG. 4 around the partition wall 115 of the ferrite core 110. Referring to FIG. 4, a wire structure 160a for the antenna coil of the inductively coupled plasma reactor according to an embodiment of the present invention has a shape of a thin strip extending as a whole and includes a plurality of electrically conductive wires arranged in parallel along the length direction and a covering 180 formed of a flexible material and covering the entire plurality of electrically conductive wires 170.

Each of the plurality of electrically conductive wires 170 is disposed to extend along the length direction of the wire structure 160a for the antenna coil, and the plurality of electrically conductive wires 170 are arranged to be sequentially parallel to each other along the width direction of the wire structure 160a for the antenna coil. AC power by a power source (190 in FIG. 2) is applied to the plurality of electrically conductive wires 170. In the present embodiment, the electrically conductive wire 170 is described as being a copper wire, but the present invention does not limit the material of the electrically conductive wires 170 to copper. In addition, although that six electrically conductive wires 170 are used in the drawing, the present invention does not limit the number of electrically conductive wires 170 to six.

Figure 5:
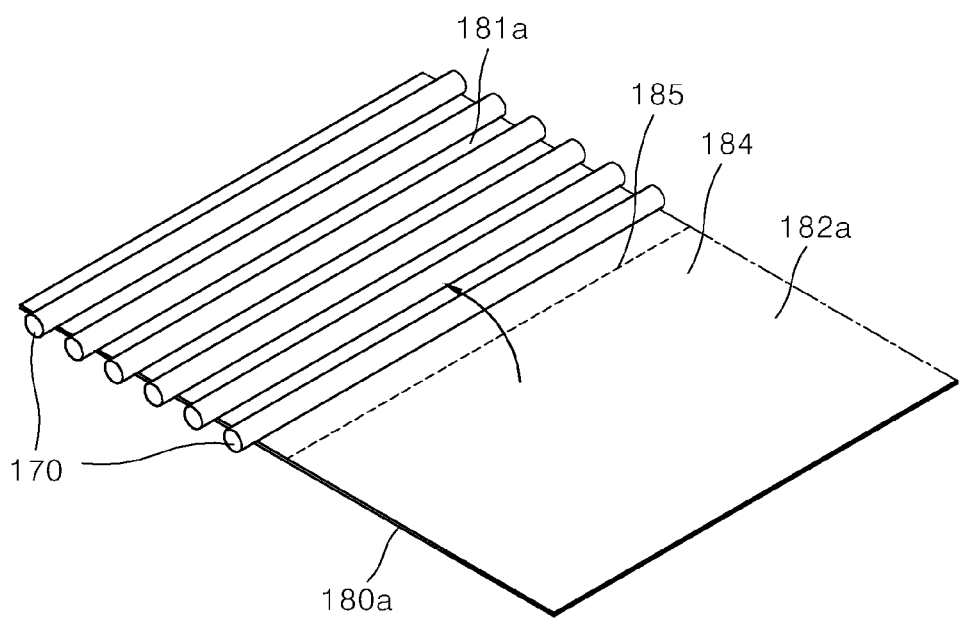
FIG. 5 is a view illustrating a process of manufacturing the wire structure shown in FIG. 4.

The covering 180 is in the form of a thin strip and surrounds the entire plurality of electrically conductive wires 170. The covering 180 is made of a flexible and electrically insulating material. The covering 180 includes a first covering sheet portion 181 and a second covering sheet portion 182 adhered with a plurality of electrically conductive wires 170 therebetween. In the present embodiment, it will be described that the covering 180 is an adhesive tape coated with an adhesive on one side. In this case, the covering 180 may be manufactured in a manner as shown in FIG. 5. Referring to FIG. 5, a folding line 185 extending along the length direction of the adhesive tape 180a is formed on the adhesive tape 180a and generally passing through the center in the width direction. The adhesive tape 180a is divided into a first side portion 181a and a second side portion 182a by the folding line 185. After a plurality of electrically conductive wires 170 are disposed on the adhesive surface of the first side portion 181a, adhered and fixed, the second side portion 182a is folded around the folding line 185 so that the first side portion 181a and the second side portion 1812a are adhered to each other. In FIG. 5, the first side portion 181a of the adhesive tape 180a forms the first covering sheet portion (181 of FIG. 4) of the covering (180 of FIG. 4), and the second side portion 182a of the adhesive tape 180a forms the second covering sheet portion (182 of FIG. 4) of the covering (180 of FIG. 4). In the present embodiment, it will be described that a polyimide tape called Kapton Tape is generally used as the adhesive tape 180a.

In the present embodiment, the first covering sheet portion (181 of FIG. 4) and the second covering sheet portion (182 of FIG. 4) of the covering (180 of FIG. 4) are formed by one adhesive tape (180a of FIG. 5). However, unlike this, the first covering sheet portion (181 of FIG. 4) and the second covering sheet portion (182 of FIG. 4) may be formed by separate sheets, and this also falls within the scope of the present invention. In this case, both sheets may be adhesive tapes, but only one may be adhesive tapes.

The wire structure 160a for the antenna coil of the inductively coupled plasma reactor according to the present invention provides a sufficient cross-sectional area to enable high voltage application by arranging a plurality of electrically conductive wires 170 in parallel, and a plurality of electrically conductive wires 170 are wound around the covering 180 having a strip shape and made of a flexible material so that the convenience of operation is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An inductively coupled plasma reactor comprising:
a reaction chamber configured to provide a plasma reaction space;
a ferrite core arranged to surround the plasma reaction space; and
an antenna coil formed by winding a wire structure on the ferrite core,
wherein the wire structure comprises a plurality of electrically conductive wires arranged in parallel and a strip-shaped covering made of a flexible material and configured to surround the plurality of electrically conductive wires.

2. The inductively coupled plasma reactor of claim 1, wherein the ferrite core comprises a border wall and a partition wall located in an inner region of the border wall, connected to the border wall and configured to divide the inner region into a first passage portion and a second passage portion, and the antenna coil is wound around the partition wall.

3. The inductively coupled plasma reactor of claim 2, wherein the reaction chamber comprises a first connection pipe passing through the first passage portion and a second connection pipe passing through the second passage portion, and the first connection pipe and the second connection pipe are separated from each other, and a slot in which the partition wall and the antenna coil are located, is formed between the first connection pipe and the second connection pipe.

4. A wire structure for an antenna coil of an inductively coupled plasma reactor so as to form the antenna coil by winding the antenna coil on a ferrite core in the inductively coupled plasma reactor including a reaction chamber configured to provide a plasma reaction space and a ferrite core arranged to surround the plasma reaction space, the wire structure comprising:
a plurality of electrically conductive wires arranged in parallel; and
a strip-shaped covering made of a flexible material and configured to surround the plurality of electrically conductive wires.

5. The wire structure for an antenna coil of an inductively coupled plasma reactor of claim 4, wherein the plurality of electrically conductive wires are sequentially spaced apart from each other along a width direction of the covering.

6. The wire structure for an antenna coil of an inductively coupled plasma reactor of claim 4, wherein the covering comprises a first covering sheet portion and a second covering sheet portion adhered with the plurality of electrically conductive wires therebetween.

7. The wire structure for an antenna coil of an inductively coupled plasma reactor of claim 4, wherein the covering is formed by folding an adhesive tape so that adhesive surfaces of the adhesive tape are adhered to each other, and the plurality of electrically conductive wires are adhered and fixed to the adhesive surfaces.

* * * * *